(12) United States Patent
Dekker et al.

(10) Patent No.: US 8,067,802 B2
(45) Date of Patent: Nov. 29, 2011

(54) FLEXIBLE DEVICE AND METHOD OF MANUFACTURING THE SAME

(75) Inventors: Ronald Dekker, Eindhoven (NL); Theodorus Martinus Michielsen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/561,532

(22) PCT Filed: Nov. 4, 2003

(86) PCT No.: PCT/IB03/04925
§ 371 (c)(1),
(2), (4) Date: Dec. 19, 2005

(87) PCT Pub. No.: WO2004/042780
PCT Pub. Date: May 21, 2004

(65) Prior Publication Data
US 2006/0186512 A1    Aug. 24, 2006

(30) Foreign Application Priority Data
Nov. 8, 2002   (EP) .................................. 02079697

(51) Int. Cl.
*H01L 29/786* (2006.01)
(52) U.S. Cl. .............................. 257/347; 349/38; 349/39
(58) Field of Classification Search .................. 257/347; 349/38, 39
See application file for complete search history.

(56) References Cited

U.S. PATENT DOCUMENTS

| 4,729,061 | A | * | 3/1988 | Brown | 361/719 |
| 6,127,199 | A |   | 10/2000 | Inoue | |
| 6,724,794 | B2 | * | 4/2004 | Dudoff et al. | 372/50.21 |
| 6,750,924 | B2 | * | 6/2004 | Murade | 349/38 |
| 6,771,342 | B1 | * | 8/2004 | Hirakata et al. | 349/141 |
| 6,798,679 | B2 | * | 9/2004 | Matsumoto et al. | 365/52 |
| 6,894,734 | B1 | * | 5/2005 | Ihara | 349/38 |
| 2002/0030189 | A1 |   | 3/2002 | Ishikawa | |
| 2002/0050599 | A1 | * | 5/2002 | Lee et al. | 257/88 |
| 2004/0245538 | A1 | * | 12/2004 | Wang et al. | 257/98 |

FOREIGN PATENT DOCUMENTS

| EP | 1 256 983 A2 | 11/2002 |
| JP | 10 090668 | 7/1998 |
| JP | 2001 044445 | 6/2001 |
| WO | WO 02/073572 | 9/2002 |
| WO | WO 2004/031927 | 4/2004 |

OTHER PUBLICATIONS

Sumio Utsunomiya et al: Flexible TFT-LEPD Transferred Onto Plastic Substrate Using Surface Free Technology by Laser Ablation/Annealing; Conference Reports of Eurodisplay 2002; pp. 79-82; Oct. 2-4, 2004.

* cited by examiner

*Primary Examiner* — Michael Shingleton

(57) ABSTRACT

The rollable device of the invention comprises a substrate of an insulating material (12) with apertures (15) extending from a first to a second side. On the first side switching elements (13) are present, as well as interconnect lines and the like, covered by a coating of organic material (3). On the second side a functional layer is present. Examples of such functional layers include capacitors, antennas and particularly electro-optical layers. Thus, with a rollable display that may include an antenna and a driver circuit is obtained.

8 Claims, 3 Drawing Sheets

FLEXIBLE DEVICE AND METHOD OF MANUFACTURING THE SAME

SUMMARY OF THE INVENTION

The invention relates to a flexible monolithic electronic device provided with:

an insulating layer of electrically insulating material having a first side and an opposed second side, which insulating layer is provided with a first aperture extending from the first to the second side;

an active layer of a semiconductor material on the first side of the substrate, in and on which active layer at least one switching element is defined, which element is provided with a first electrode in the active layer; and a flexible coating acting as a protective cover for the at least one switching element.

The invention also relates to an apparatus and a label comprising such a flexible device.

The invention also relates to a method of manufacturing a flexible monolithic electronic device comprising a plurality of switching elements, which method comprises the steps of:

providing a substrate having a first side and an opposed second side, on which first side an active layer of a semiconductor material is present, in and on which active layer switching elements are provided, first electrodes of the switching elements being present in the active layer, removing the active layer partially, such that a functional entity comprising a plurality of switching elements is present on at least one island;

applying a flexible coating to the first side of the substrate, thus covering the at least one island;

temporarily attaching a carrier substrate to the first side of the substrate; and removing the substrate from the second side, including a wet-chemical etching step by an etchant.

Such a device and such a method are described in the non-prepublished application EP02100445.2 (PHDE010137). Herein, a method is described in which the switching elements are integrated circuit elements that constitute an integrated circuit. The substrate is a silicon-on-insulator substrate in particular, having a base layer of a semiconductor material, an oxide layer and an active layer of silicon. After the provision of the coating and after a suitable pre-treatment with an adhesion agent, the carrier substrate of glass is attached by means of glue. The substrate is then thinned so as to remove the base layer by means of wet chemical etching in a bath of an alkalic etchant such as concentrated KOH. The oxidic layer acts herein as an etch stop layer, and may be removed thereafter. The exposed rear side of the integrated circuit elements may then be provided with an additional metallization level with bond pads. The carrier substrate is thereafter removed in that the device is peeled off from the substrate or vice versa.

It is a first object of the invention to provide a device of the kind mentioned in the opening paragraph with more functionality.

It is a second object of the invention to provide a method of the kind mentioned in the opening paragraph whereby the device of the invention can be advantageously manufactured.

The first object is realized in that a functional layer is present on the second side of the insulating layer and is connected to the first electrode through the first aperture in the insulating layer. The term 'functional layer' is to be understood to mean a layer that extends over a substantial part of the substrate area and which fulfills in the device, alone or in combination with the switching elements, a specific function. Examples include electro-optical layers, conductive layers in which antennas are defined, high-K dielectric layers, such as ferroelectric layers for capacitors, layers for sensor applications, such as adhesion layers comprising antibodies for the adhesion of peptides, proteins or other biological material The integration of such a functional layer in the device is particularly important for very flexible and preferably rollable devices, in which the flexibility acts as a burden for assembly. Even if a flexfoil can be suitably attached to bond pads, it is generally desired to use such flexfoil for power distribution only and if necessary for signal transfer. Any further elements, however, should be integrated.

In a preferred embodiment of the device, the functional layer is an electro-optical layer which constitutes, in conjunction with a switching element, a display pixel. A rollable display can be made due to the provision of the electro-optical layer at the second side of the substrate. Such a rollable display is meant for use in combination with a mobile apparatus such as a mobile phone. A display cartridge of this kind is described, for example, in the non-prepublished application EP02079131.5 (PHNL020942).

Electro-optical layers that are suitable for use in the invention include liquid-crystalline layers, organic, polymeric or inorganic electroluminescent layers as well as electrophoretic layers. Particularly electrophoretic layers are preferred, since these provide good contrast.

A technique for manufacturing a flexible display is known per se as SUFTLA®. It is disclosed in S. Utsunomniya et al. 'Flexible TFT-LEPD transferred onto plastic substrate using surface free technology by laser ablation/annealing' that was published in the Conference reports of Eurodisplay 2002, pp. 79-82. The flexible display of this technology is manufactured by provision of thin film transistors on a glass substrate with a sacrificial amorphous silicon layer. Subsequently, the glass substrate is replaced by a plastic substrate and the electro-optical layer is provided on the first side of the substrate. As can be seen from FIG. 4 of the cited paper, the resulting display is flexible in so far that it can be bent. However, it is by no means rollable as a foil. This is due, according to the inventors, to the fact that the source and drain electrodes of the transistors are provided with metallizations, one of which is again interconnected to the pixel electrode. A relatively thick layer of insulating material is therein needed to cover the transistors and to act as a substrate for the pixel electrode. In the device of the invention, the second side of the substrate is in principle completely planar. Hence, neither a metallization for the source and drain electrodes nor an insulating layer of sufficient thickness to cover the transistor is needed.

It is suitable, for instance, for an electro-optical layer of liquid crystalline material or of electroluminescent material, that a further electrode layer is present as a counterelectrode. Other layers known to a person skilled in the art of the specific display types can also be present if desired, such as a hole injection layer comprising poly (3,4-ethylenedioxythiophene) in the case of organic electroluminescent devices. Also, a further protective layer may be present adjacent to the further electrode layer.

In a further embodiment an electrically conductive layer is present between the active layer and the functional layer, in which conductive layer a pixel electrode is defined. Although the pixel electrode may be defined in the active layer, which is of course suitably provided in known manner with dopant atoms so as to be electrically conductive at the area of the electrodes, it is preferred to provide it as a separate layer. This enables optimum use of available space and enlarges the freedom of choice with respect to the substrate. Otherwise, the insulating layer needs to be relatively thin in order to have a substantially planar surface for the electro-optical layer. Furthermore, the capacity between the pixel electrode and metal lines present in interconnect layers in order to drive the gate electrode of the transistor can become too high in that case.

In an even further embodiment the display pixel comprises a capacitor with a first and a second electrode and a dielectric, which first electrode is present in the electrically conductive layer and which second electrode is defined in the active layer, the substrate acting as the dielectric. For displays which are voltage driven, such as an active matrix liquid-crystalline display, it is necessary to include a capacitor in each pixel. This capacitor can be advantageously integrated when the first electrode is provided in the electrically conductive layer.

It is thus preferred that the substrate is provided with a high-K area and with a low-K area, which high-K area acts as the dielectric of the capacitor. This embodiment minimizes parasitic capacity between the electrically conductive layer and the active layer, while the capacitance density can be sufficiently high at the same time. This embodiment can be suitably made in that a provisional substrate, for instance of glass or of silicon-on-insulator, is first removed so that only the active layer is left. Then various layers can be provided and photolithographically patterned and etched. Suitable materials for the low-K area include SiLk, polyimide, benzocyclobutene, silicon oxide, organically modified silica and hydrogen and methylsilsesquioxane. Suitable materials for the high-K area include silicon nitride and ferroelectronic oxides with perovskite structures that may be provided by sol-gel processing.

In a further embodiment of the display, the switching element is part of an array of switching elements present in and on the active layer, which array is driven by a driving circuit comprising an integrated circuit of circuit elements present in and on the active layer. As the connection of the flexible device to external parts is undesired, it is highly preferred to include any driver circuit in the device itself. This is very well possible in that the active layer can be made of high-quality monocrystalline or polycrystalline silicon that is completely suitable for driver electronics.

In another embodiment of the invention the functional layer is an electrically conductive layer in which an antenna is defined and a plurality of interconnected switching elements is provided so as to constitute an integrated circuit. The antenna of this embodiment allows contactless communication between the integrated circuit and a reader. This communication includes the transfer of signals, but may include the transmission of power as well. Such an antenna is suitable for low and moderate frequencies. For very high frequencies and short distances, i.e. above 2 GHz, an antenna may be included in the circuit. The antenna can be suitably made in that the substrate acts as a mask for depositing a seed layer and subsequent electroplating. Also a barrier layer may be provided if desired.

The insulating layer of the device of the invention may contain an oxide. or any other insulating layer such as nitride or oxynitride. It may be deposited after removal of a provisional substrate. For instance, if a mono- or polycrystalline substrate is used, this may be largely removed by first grinding and then etching according to a desired pattern. A mesa-structure of the substrate, constituting the active layer, will then be left. This forms an island-like shape. The insulating layer with the aperture is thereafter applied. In case that the thermal oxide acts as the insulating layer, the situation as claimed in claim 2 applies. Alternatively, a substrate with a buried oxide layer can be used and the buried oxide is not removed but patterned. Particularly in the case of a substrate with an oxide layer it is preferred that the coating is provided with an oxide layer as well. It has been found that this counteracts uncontrollable curling of the device.

The active layer particularly comprises an inorganic semiconductor material, such as Si, GaAs or another III-V or II-VI material. The electrode in this active layer is conventially formed as a doped zone comprising charge carriers of n- or p-type.

The coating of the device of the invention typically has a thickness of the order of from 1 to 50 µm preferably from 2 to 5 µm. It comprises an organic material by preference in view of the excellent flexibility of such materials. Suitable materials include among others epoxide, phenol, melamine, polyester, silicon resin or a polymer or copolymer hereof or a blend with other polymers, and may be reinforced with fibers, pigments, fillers, glass or metal. High-grade products which are still stable at higher temperatures that may be necessary in view of operating conditions or the provision of suitable materials on the second side of the substrate are for instance based on polyimide resins, polycarbonate resins, fluorocarbon resins or polysulphon resins. Further information relating to the choice of the polymer can be found in the above-mentioned non-prepublished application EP02100445.2 (PHDE010137).

The device of the invention can be suitably sold as part of a label and be used in combination with any apparatus suitable use for the embodiment with the antenna is in the area of identification and security. Suitable use for the display includes such identification and security issues, but may also be used for information purposes, as part of documents on paper for instance. For this purpose, it is not only advantageous that a driver circuit is present, but also that an antenna is present for contactless communication of power and signals.

The object to provide an improved method of the kind described in the opening paragraph is achieved in that the applied coating of an organic material is provided with protection areas on side faces of the coating, and that the removal of the substrate includes a wet-chemical etching step by an etchant, the coating being protected against said etchant through the protection areas. In experiments it was found that the coating may be prone to swelling as a result of the interaction with the etchant, particularly with a strong base etchant as KOH. This swelling is not only detrimental to the appearance. It is also problematic for the provision of layers on the second, rear side of the substrate. Due to the swelling, the substrate is not planar enough, and layers cannot be provided with a sufficient resolution. In the method of the invention, this problem is solved through the definition of protection areas on the side faces of the coating where it is in contact with the etchant during immersion in a bath thereof.

In a preferred embodiment the organic material is applied according to a desired pattern, such that it is absent at the protection areas and present at device areas. Thereafter, the protection areas are given a treatment with adhesion means, and the removal of the electronic device from the carrier substrate is substantially limited to the device areas. Due to the patterning a glue layer is present in the protection areas and it is well adhered to the substrate due to the treatment with adhesion means. Therewith it constitutes an adequate protection of the organic material against the etchant.

In order to counteract curling and to provide very good adhesion at the protection areas, an oxidic layer can be provided on top of the coating of organic material. This has the additional advantage that silane coupling agents can be used as adhesion means. Examples include 3-methacryloyloxypropyl trimethoxysilane and glycidyloxypropyl trimethoxysiliane. After application of the carrier substrate of glass, the hydroxyl groups of the glass and the methoxy groups of the silane react with each other with the release of methanol. The silane is thus bonded covalently to the glass surface through Si—O—Si bonds.

The carrier substrate will be removed before the devices are used. This removal step can be done directly after manufacture of the devices. This has the advantage that the carrier substrate can be reused. However, the removal step of the carrier substrate may also be done by a customer; this is particularly useful if the devices contain integrated circuits for security or identification purposes. Before such removal, the individual devices can then be programmed so as to contain an identification code. Moreover, the removal step may not be carried out before the devices are attached to another carrier substrate that will not be used. Such a substrate, for instance of paper, can then be cut along lines so as to obtain a series of flexible devices. Preferably, the removal of the carrier substrate is realized by means of cutting, for instance with a razor blade.

It is observed that the protection areas need not to be present between individual devices. Principally, it is sufficient if these areas are present only at the outer edge of the substrate comprising a plurality of individuality devices, also known as a wafer. It is furthermore observed that the method can also be applied without the step of the provision of a functional layer at the second side of the substrate.

BRIEF DESCRIPTION OF THE DRAWINGS

These and other aspects of the device and the method of the invention will be further explained and elucidated with reference to the figures, in which.

DETAILED DESCRIPTION OF THE INVENTION

The figures are not drawn to scale and like reference numbers refer to like parts. The figures are examples only and by no means limit the scope of the invention.

Figure 1:
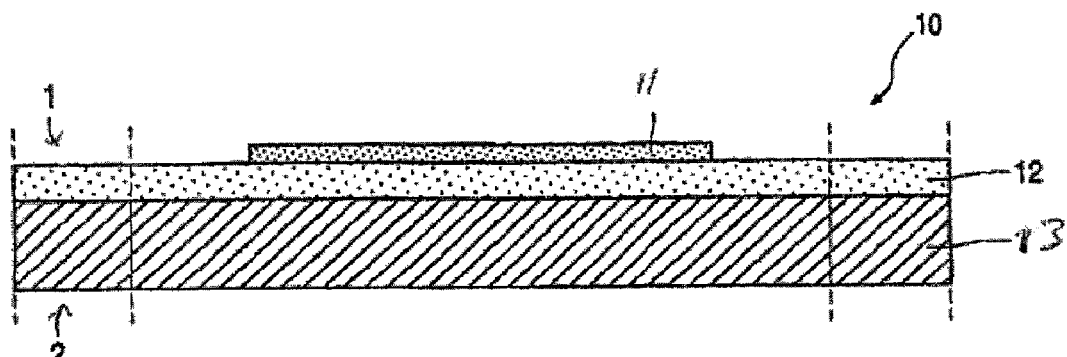
FIGS. 1-6 show various steps of the method in diagrammatic cross-sectional views.

FIG. 1 shows a substrate 10 with a first side 1 and a second side 2. The substrate 10 comprises an active layer 11, an oxidic layer 12 and a base layer 13. The substrate 10 is in this case a silicon on insulator substrate in which both the base layer 13 and the active layer 11 comprise silicon. The active layer 11 herein is of monocrystalline silicon. However, the active layer 11 may be a polycrystalline or amorphous silicon layer as well that is processed on an oxidized silicon wafer. The oxidic layer 12 is then for instance provided with PECVD. Alternatively, the oxidic layer 12 may be a highly doped buried layer. A glass substrate may also be used as a base layer 13.

Switching elements (not shown) are defined in the active layer 11 and on top thereof. The switching elements are transistors of the CMOS or TFT type, but may also be MicroElectroMechanical System (MEMS) switches or pindiodes. Further elements such as diodes, Schottky diodes, bipolar transistors, capacitors, resistors, optoelectrical elements and others may be present as well. They are interconnected according to a desired circuit pattern that is known per se to a person skilled in the art. Due to the use of an active layer 11 of a semiconductor material, preferably silicon, but possibly any III-V semiconductor material, a conventional circuit pattern can be used. To manufacture the switching and other elements processes are carried out at or in the vicinity of the active layer 11. These processes include for instance oxidation steps, photolithography steps, selective etching steps and intermediate doping steps such as diffusion or ion implantation, all of which are known per se. In the case of thin film or CMOS transistors, source and drain electrodes as well as an intermediate channel are provided in the active layer that is covered by a gate oxide layer and a gate electrode of polycrystalline silicon, a metal, a silicide. Additional metal layers for interconnection purposes can be provided. However, it is preferred to keep the number of layers limited. Subsequently, or after various intermediate steps, superfluous regions of the active layer 11 and any layer on top of it are removed by wet-chemical or dry etching so as to obtain at least one island-like structure of the active layer 11. For example, FIG. 1 schematically illustrates a resulting structure of the substrate 10 after the active layer 11 is partially removed to form at least one island structure such that a functional entity comprising a plurality of switching elements is present on the at least one island structure.

Figure 2:
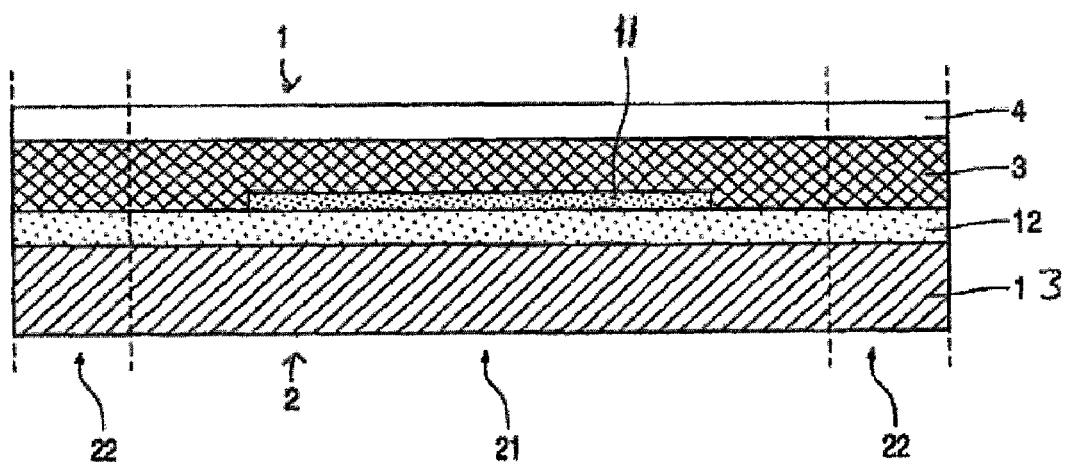

A next process step includes forming a flexible coating 3 of organic material, such as a polymer material, on the first side 1 of the substrate 10 to cover the island structure(s) of the active layer 11, such as shown in FIG. 2. Preferably, the flexible coating 3 is provided by spin coating, spraying or the formation of a film, and is subsequently cured. The adhesion of the coating 3 to the active layer 11 and the stack of layers on top of the active layer 11 is enhanced using a process that includes an initial cleaning step with fuming HNO3 followed by treatment with a suitable primer. Then a polyamide resin coating 3 is formed in that a precursor of the polyimide is applied. After spincoating a solution of this material onto the wafer, the solvent is evaporated at 125° C. Thereafter, a heating step at 200° C. is done to activate the primer.

After the flexible coating 3 is formed, the flexible coating 3 is patterned through a photoresist mask. In particular, as shown in FIG. 2, a layer of photoresist 4 such as HPR504 is applied over the flexible coating 3. The layer of photoresist 4 is then exposed to form a photoresist mask in which a portion of the layer of photoresist 4 is present at the device area 21 and removed at the protection areas 22.

Figure 3:
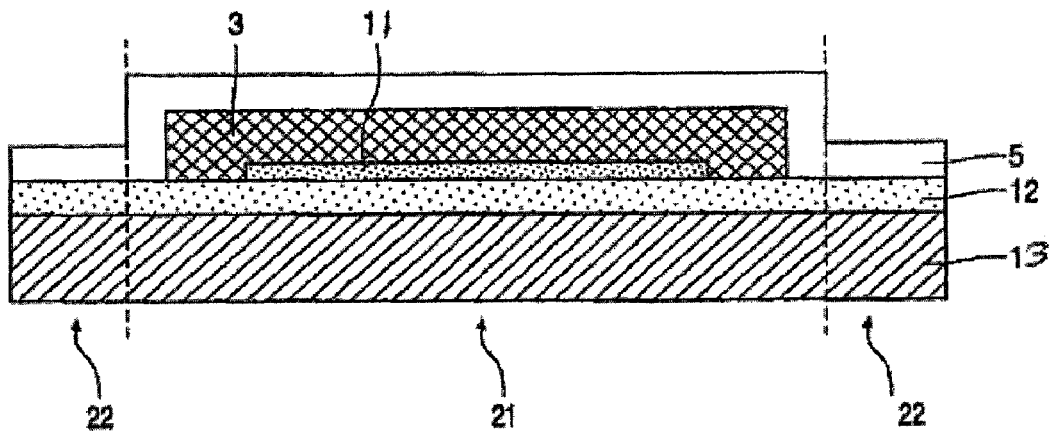

FIG. 3 shows the result after the flexible coating 3 is patterned through the photoresist mask to remove portions of the coating 3 in protection areas 22 and maintain portions of the coating 3 in device areas 21 covering the active layer 11 of island structures. The patterning of the coating 3 is realized with conventional developer solutions such as cyclopentanon. Then, the remaining photoresist material is stripped in a mixture of aceton and isopropanol. Subsequently, the coating 3 is cured at 300-400° C.

As further depicted in FIG. 3, an optional oxide layer 5 is formed on the substrate 10 covering the protection area 22 and the flexible coating 3 in device area 21. The oxide layer 5 may be a 0.5 µm thick layer of PECVD oxide that is deposited at about 300° C.

Figure 4:
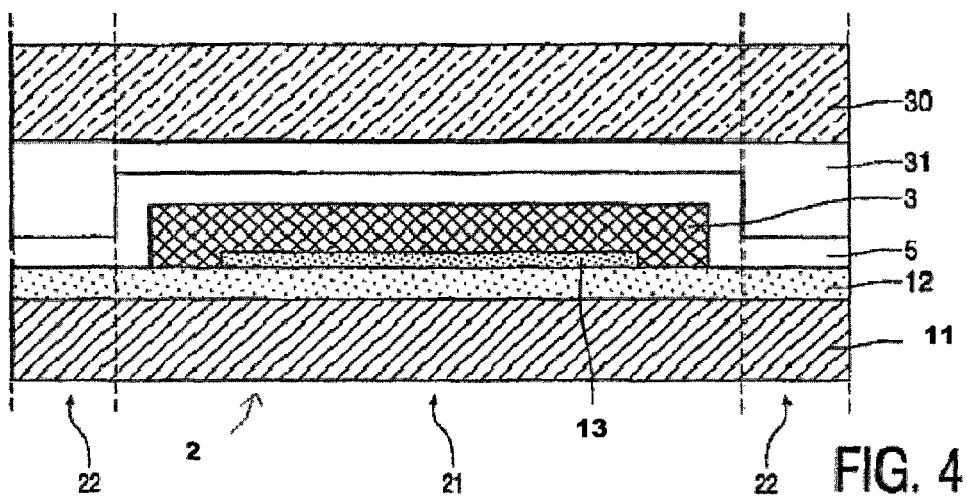
Figure 5:
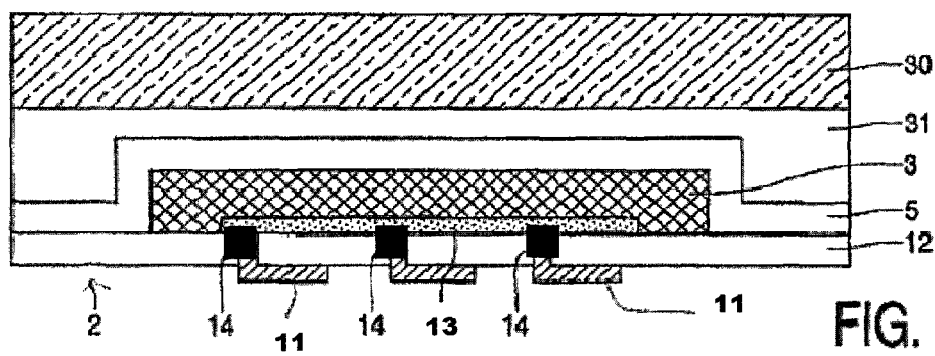

Next, the substrate 10 is temporarily attached to a carrier substrate and then thinned. For example, FIG. 4 schematically illustrates a resulting structure obtained after attaching a carrier substrate 30 to the first side of the substrate 10, and FIG. 5 schematically illustrates a resulting substrate structure after removing the base layer 13 on the second side 2 of the substrate 10. Hereto, the protection areas 22 are treated with adhesion means, in this case a silane coupling agent. This treatment is done in a so-called "edge beat removal" fashion. Alternatively, the protection areas 22 are dipped into a solution of this silane primer. After a suitable pre-treatment process with an adhesion agent is performed, the carrier substrate 30 of glass is attached to the substrate 10 by means of glue 31. The substrate 10 is then thinned so as to remove the base layer 13. The thinning of the substrate 10 is done in two steps, in the first of which the base layer 13 is grinded, after which it is etched by means of wet chemical etching in a bath of an alkalic etchant such as a concentrated KOH solution. Herein the oxidic layer 12 acts as an etch-stop layer.

FIG. 5 shows the result after removing the base layer 13 and apertures 14 have been provided in the oxidic layer 12. This is done in that a photoresist is deposited on the oxidic layer 12 and patterned to form a mask. The oxidic layer 12 is then patterned using the mask. After that metal is provided in the apertures 14. This metal deposition includes a first step of depositing a barrier layer of $Ti_{0.9}W_{0.1}$ onto which Al is deposited as usual. Alternatively, Cu can be deposited by electroplating.

Figure 6:
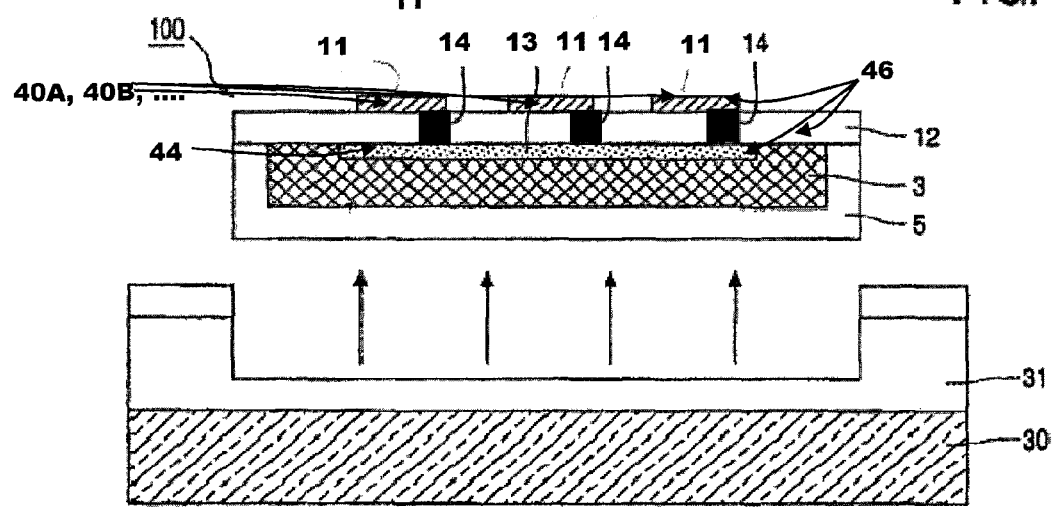

FIG. 6 shows the result after removal of the flexible device 100 from the carrier substrate 30. This is done by cutting through the oxidic layer 5 with a razor blade. Although the flexible device 100 is shown here as one device, it will be understood that a plurality of devices 100 is also feasible. These devices may be separated afterwards. The separation step may also be done by the customer.

The flexible device of FIG. 6 includes switching elements 40A, 40B, . . . arranged as an array of switching elements in and on the active layer 11. An electrically conductive base layer 13 is present between the active layer 11 and a functional layer (not shown). A display pixel electrode 44 is defined in the conductive base layer 13. The display pixel includes a capacitor 46 with one electrode and another electrode and a dielectric formed from the insulating layer 12 including a high-k area. The display pixel electrode is present in the functional layer and the electrode is defined in the active layer, with the insulating layer 12 acting as the dielectric.

Figure 7:
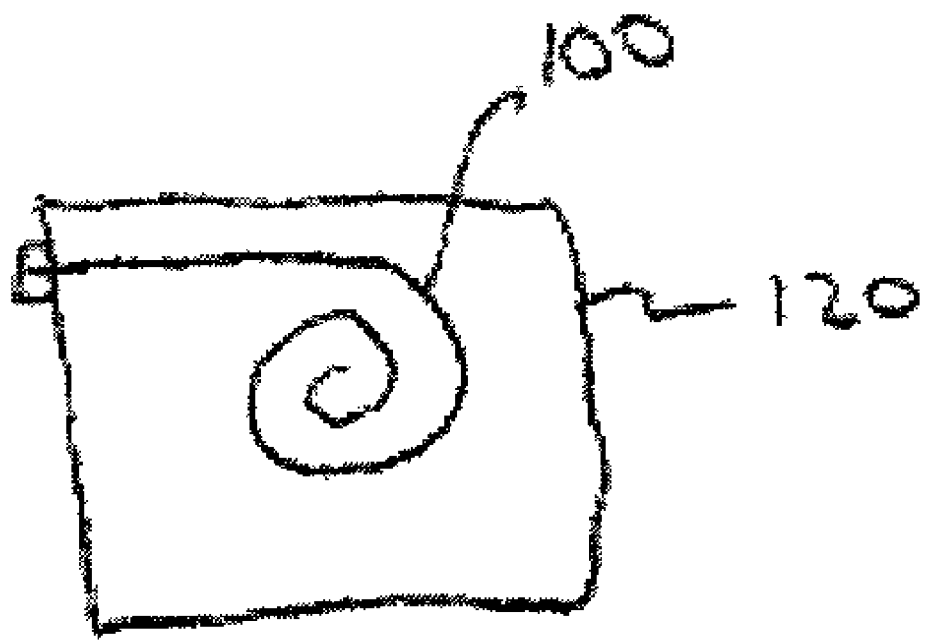
FIG. 7 shows an embodiment of the present system included as a rollable cartridge.

FIG. 7 shows an embodiment of the flexible device 100 included in a rollable cartridge 120.

Summarizing, the rollable device of the invention comprises a substrate of insulating material with apertures extending from a first to a second side. On the first side switching elements are present, as well as interconnect lines and the like, covered by a coating of organic material. A functional layer is present on the second side. Examples of such functional layers include capacitors, antennas and particularly electro-optical layers. A rollable display is thus obtained that may include an antenna and a driver circuit.

The invention claimed is:

1. A flexible monolithic electronic device, comprising:
   a substrate layer of electrically insulating material having a first side and an opposed second side, the substrate layer having at least one aperture extending from the first to the second side;
   a base layer of semiconductor material disposed on and in contact with the first side of the substrate layer for forming a first electrode;
   an active layer of semiconductor material disposed on and in contact with the second side of the substrate layer for forming a second electrode, the active layer including at least one switching element; and
   a flexible coating formed on the first side of the substrate layer for acting as a protective cover for the at least one switching element,
   wherein the at least one aperture extends from the base layer to the active layer and is filled with conductive material.

2. The flexible electronic device as claimed in claim 1, wherein the electronic device comprises a display pixel.

3. The flexible electronic device as claimed in claim 2, wherein the base layer is electrically conductive and is present between the active layer and the flexible coating, and the first electrode is a pixel electrode.

4. The flexible electronic device as claimed in claim 3, wherein the display pixel comprises a capacitor having the first and second electrodes and a dielectric, the first electrode is provided in the electrically conductive layer and the second electrode is provided in the active layer, the substrate layer acting as a dielectric.

5. The flexible electronic device as claimed in claim 4, wherein the substrate layer further comprises a high-K area which acts as the dielectric of the capacitor.

6. The flexible electronic device as claimed in claim 2, wherein the switching element is part of an array of switching elements provided on the active layer, the array is driven by a driving circuit comprising an integrated circuit of circuit elements provided in and on the active layer.

7. An apparatus comprising:
   a substrate layer of electrically insulating material having a first side and an opposed second side, the substrate layer having at least one aperture extending from the first to the second side;
   a base layer of semiconductor material disposed on and in contact with the first side of the substrate layer for forming a first electrode;
   an active layer of semiconductor material disposed on and in contact with the second side of the substrate layer for forming a second electrode, the active layer including at least one switching element; and
   a flexible coating formed on the first side of the substrate layer for acting as a protective cover for the at least one switching element,
   wherein the at least one aperture extends from the base layer to the active layer and is filled with conductive material, and
   wherein the substrate layer, base layer, active layer and flexible coating are flexible.

8. A cartridge comprising:
   a display pixel including:
      a substrate layer of electrically insulating material having a first side and an opposed second side, the substrate layer having at least one aperture extending from the first to the second side;
      a base layer of semiconductor material disposed on and in contact with the first side of the substrate layer for forming a first electrode;
      an active layer of semiconductor material disposed on and in contact with the second side of the substrate layer for forming a second electrode, the active layer including at least one switching element; and
      a flexible coating formed on the first side of the substrate layer for acting as a protective cover for the at least one switching element,
      wherein the at least one aperture extends from the base layer to the active layer and is filled with conductive material,
      wherein the substrate layer, base layer, active layer and flexible coating are rolled within the cartridge.

* * * * *